(12) United States Patent
Doglio et al.

(10) Patent No.: US 11,997,822 B2
(45) Date of Patent: May 28, 2024

(54) MODULAR DESIGN TO SUPPORT VARIABLE CONFIGURATIONS OF FRONT CHASSIS MODULES

(71) Applicant: Dell Products L.P., Round Rock, TX (US)

(72) Inventors: Jean Marie Doglio, Round Rock, TX (US); Richard W. Guzman, Austin, TX (US); Sean P. O'Donnell, Poughkeepsie, NY (US); Nicholas Adam Kelly, Georgetown, TX (US); Robert G. Bassman, Dalton, MA (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/509,927

(22) Filed: Oct. 25, 2021

(65) Prior Publication Data

US 2023/0126299 A1 Apr. 27, 2023

(51) Int. Cl.
*H05K 7/14* (2006.01)
*G06F 1/18* (2006.01)
*G11B 33/12* (2006.01)

(52) U.S. Cl.
CPC ........... *H05K 7/1489* (2013.01); *G06F 1/183* (2013.01); *G06F 1/186* (2013.01); *G06F 1/187* (2013.01); *G11B 33/127* (2013.01); *G11B 33/128* (2013.01)

(58) Field of Classification Search
CPC .. H05K 7/1429; H05K 7/1474; H05K 7/1485; H05K 7/1487; H05K 7/1488; H05K 7/1489; H05K 5/04; H05K 5/02; H05K 7/18; H05K 7/183; H05K 9/0037; G06F 1/181; G06F 1/182; G06F 1/183; G06F 1/186; G06F 1/187; G11B 33/124; G11B 33/128; G11B 33/127
USPC ...................................... 361/679.02
See application file for complete search history.

(56) References Cited

U.S. PATENT DOCUMENTS

| | | | | |
|---|---|---|---|---|
| 5,587,879 | A * | 12/1996 | Spano | G11B 33/124 |
| 5,742,478 | A * | 4/1998 | Wu | H05K 7/20445 |
| | | | | 361/728 |
| 6,120,116 | A * | 9/2000 | Phillips | H05K 7/1424 |
| | | | | 312/111 |
| 6,388,873 | B1 * | 5/2002 | Brooks | G11B 33/121 |
| 6,612,667 | B2 * | 9/2003 | Tsai | H05K 7/1461 |
| 6,999,307 | B2 * | 2/2006 | Peng | G06F 1/187 |
| | | | | 361/679.33 |

(Continued)

*Primary Examiner* — Adrian S Wilson
*Assistant Examiner* — Gage Crum
(74) *Attorney, Agent, or Firm* — Larson Newman, LLP

(57) ABSTRACT

A chassis assembly includes a rack chassis and a block assembly. The rack chassis includes a left side panel and a right side panel that are made from one continuous single material. The left side panel includes a left rail guide, and the right side panel includes a right rail guide. The block assembly is adapted to slide into the rack chassis and includes a top cover, a left sidewall, and a right sidewall that are interconnected. The left sidewall of the block assembly includes a left rail adapted to slide into the left rail guide when the block assembly is located leftmost of the rack chassis. The right sidewall of the block assembly includes a right rail that is adapted to slide into the right rail guide when the block assembly is located rightmost of the rack chassis.

17 Claims, 14 Drawing Sheets

(56) References Cited

U.S. PATENT DOCUMENTS

| | | | |
|---|---|---|---|
| 7,190,574 B2* | 3/2007 | Muenzer | G06F 1/184 |
| | | | 361/679.33 |
| 9,055,691 B2 | 6/2015 | Doglio et al. | |
| 9,122,458 B2* | 9/2015 | Yu | G06F 1/185 |
| 9,301,419 B1* | 3/2016 | Tsai | G11B 33/128 |
| 9,674,978 B2* | 6/2017 | Wu | G06F 1/185 |
| 10,264,701 B1* | 4/2019 | Norton | H05K 7/1488 |
| 10,340,691 B2 | 7/2019 | Bailey et al. | |
| 10,782,748 B1* | 9/2020 | Tsorng | G11B 33/124 |
| 2003/0155471 A1* | 8/2003 | Dean | G11B 33/128 |
| 2004/0150959 A1* | 8/2004 | Sullivan | G06F 1/20 |
| | | | 361/728 |
| 2004/0257760 A1* | 12/2004 | Record | G11B 33/126 |
| 2005/0195563 A1* | 9/2005 | Chung | G06F 1/187 |
| | | | 361/679.39 |
| 2006/0274505 A1* | 12/2006 | Yeh | G11B 33/142 |
| 2009/0273901 A1* | 11/2009 | Jaramillo | H05K 7/1492 |
| | | | 361/679.58 |
| 2010/0053869 A1* | 3/2010 | Sun | G06F 1/184 |
| | | | 361/679.6 |
| 2011/0269339 A1* | 11/2011 | Baran | H05K 7/1474 |
| | | | 439/532 |
| 2012/0087084 A1* | 4/2012 | Nguyen | G06F 1/187 |
| | | | 361/679.37 |
| 2013/0220952 A1* | 8/2013 | Zhou | G11B 33/128 |
| | | | 211/26 |
| 2013/0258620 A1* | 10/2013 | Qiu | G11B 33/128 |
| | | | 361/759 |
| 2013/0328466 A1* | 12/2013 | Chang | G06F 1/20 |
| | | | 312/236 |
| 2014/0021836 A1* | 1/2014 | Hou | H05K 5/02 |
| | | | 312/223.2 |
| 2014/0108692 A1 | 4/2014 | Doglio et al. | |
| 2014/0126140 A1* | 5/2014 | Wang | G06F 1/187 |
| | | | 361/679.37 |
| 2015/0181750 A1 | 6/2015 | Bailey et al. | |
| 2015/0189787 A1 | 7/2015 | Bailey et al. | |
| 2016/0073537 A1* | 3/2016 | Tseng | G06F 1/183 |
| | | | 361/809 |
| 2017/0301375 A1* | 10/2017 | Mayhall | G11B 33/124 |
| 2018/0014644 A1* | 1/2018 | Chen | A47B 88/49 |
| 2020/0275578 A1* | 8/2020 | Murakami | H05K 7/1489 |

\* cited by examiner

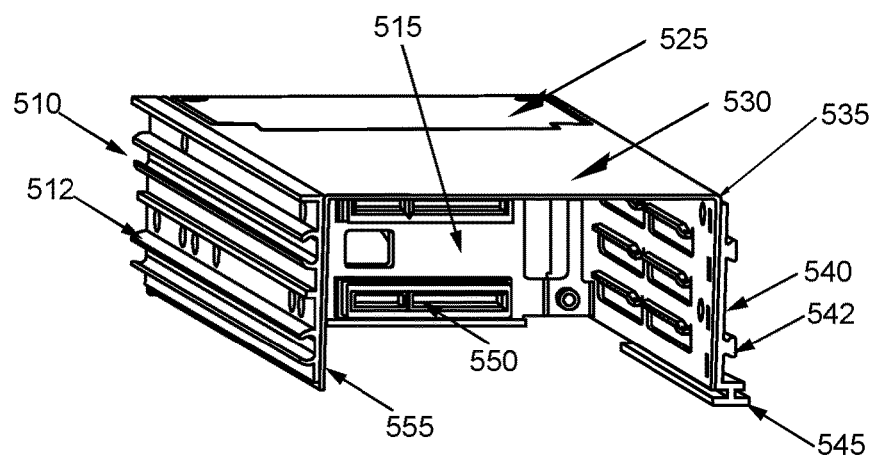
FIG. 5A
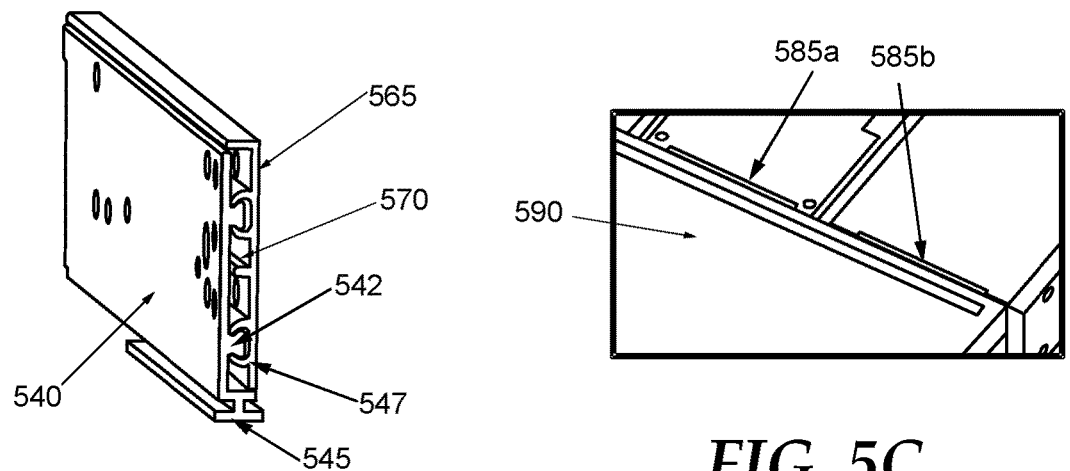
FIG. 5B
FIG. 5C

MODULAR DESIGN TO SUPPORT VARIABLE CONFIGURATIONS OF FRONT CHASSIS MODULES

FIELD OF THE DISCLOSURE

The present disclosure generally relates to information handling systems and more particularly relates to a modular design to support variable configurations of front chassis modules.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A chassis assembly includes a rack chassis and a block assembly. The rack chassis includes a left side panel and a right side panel that is made from one continuous single material. The left side panel includes a left rail guide, and the right side panel includes a right rail guide. The block assembly is adapted to slide into the rack chassis and includes a top cover, a left sidewall, and a right sidewall that are interconnected. The left sidewall of the block assembly includes a left rail adapted to slide into the left rail guide when the block assembly is located leftmost of the rack chassis. The right sidewall of the block assembly includes a right rail that is adapted to slide into the right rail guide when the block assembly is located rightmost of the rack chassis.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 5A is a diagram illustrating a block assembly to support variable configurations of front chassis modules, according to an embodiment of the present disclosure;

FIG. 5B is a block diagram illustrating a section of the block assembly, according to an embodiment of the present disclosure;

FIG. 5C is a block diagram illustrating a section of the block assembly, according to an embodiment of the present disclosure;

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Large-scale information handling systems, as utilized within data centers, are often designed in a rack configuration, having one or more servers or banks of storage physically located within a single rack chassis. Rack-based information handling systems enable larger-scale systems to be deployed in a single structure, referred to in the industry as a rack. These racks can hold a plurality of front chassis modules also referred herein as block assemblies. The block assemblies may be configured to allow the insertion of various types of information technology (IT) components which include servers, server nodes, power supplies, storage devices, other devices, etc.

Each of these IT components may be designed to fit within a specific rack configuration and are thus typically of a standard width and depth dimension to fit within the rack structure. Also, depending on the particular rack, the IT component is designed with a uniform height that is the pre-determined height of the rack. The computing power of the rack-based information handling system is typically based on the number of IT components that can be placed in the rack chassis. However, the number of IT components that can be placed in the rack chassis can vary based on the sizes and/or types of the IT components. Thus, with a growing number of IT component types and rack chassis configurations, there is a need to enable quick and easy rack chassis configuration to allow usage of different IT components or device types. To address this and other concerns, the present disclosure provides a rack-based modular structure that supports various IT components of different sizes and/or types. Once in the rack chassis, the IT components may be secured by a trim piece cover placed at the front of the rack chassis. In addition, removable perforated panels or blanks may be provided to control airflow.

Figure 1:
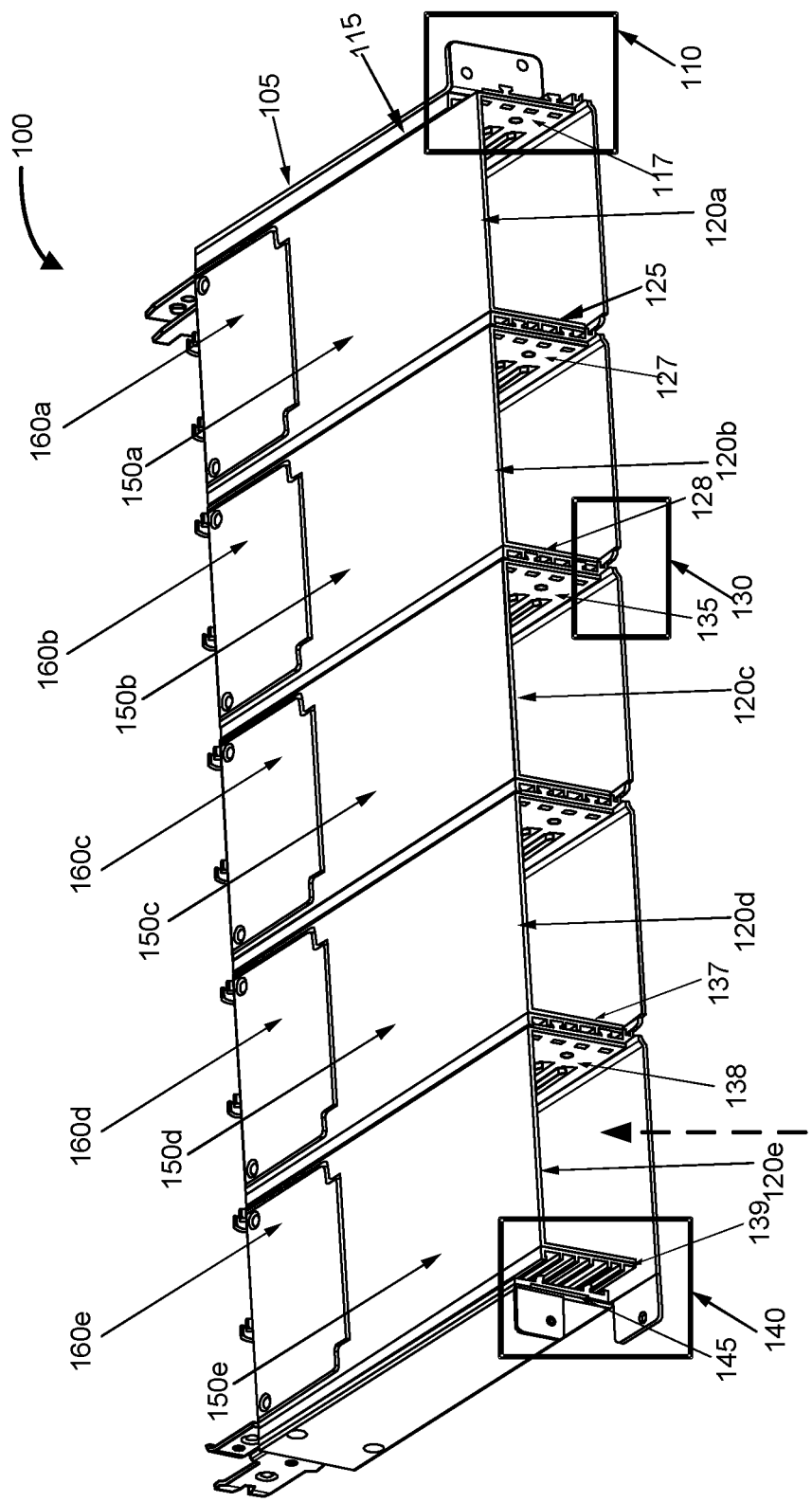
FIG. 1 is a diagram illustrating a chassis assembly with a modular design to support variable configurations of front chassis modules, according to an embodiment of the present disclosure.

FIG. 1 shows a perspective view of a chassis assembly 100 which is an embodiment of the present disclosure which has a modular design approach to support variable configurations of front chassis modules. Thus, the chassis assembly 100 is an embodiment of the present disclosure that allows for a modular, scalable, and expandable information handling system. The chassis assembly 100 includes a chassis such as a server chassis or a rack chassis 105 adapted to allow insertion of block assemblies such as block assemblies 120a-120e. In turn, a block assembly is adapted to allow the insertion of an IT component, such as IT component 170, from the front to the rear of the block assembly while the block assembly is in the chassis. The block assembly may also be adapted to allow insertion of the IT component from the bottom. For example, the IT component may be inserted from the bottom of the block assembly when the block assembly is not in the chassis. Each block assembly may include a top cover and an access panel, such as top covers 150a-150e and access panels 160a-160e accordingly. For example, block assembly 120a includes a top cover 150a and an access panel 160a. The access panel allows a user access to cabling associated with the IT component. Further, rack chassis 105 includes sections 110, 130, and 140 which are highlighted for a more detailed discussion below.

Figure 13:
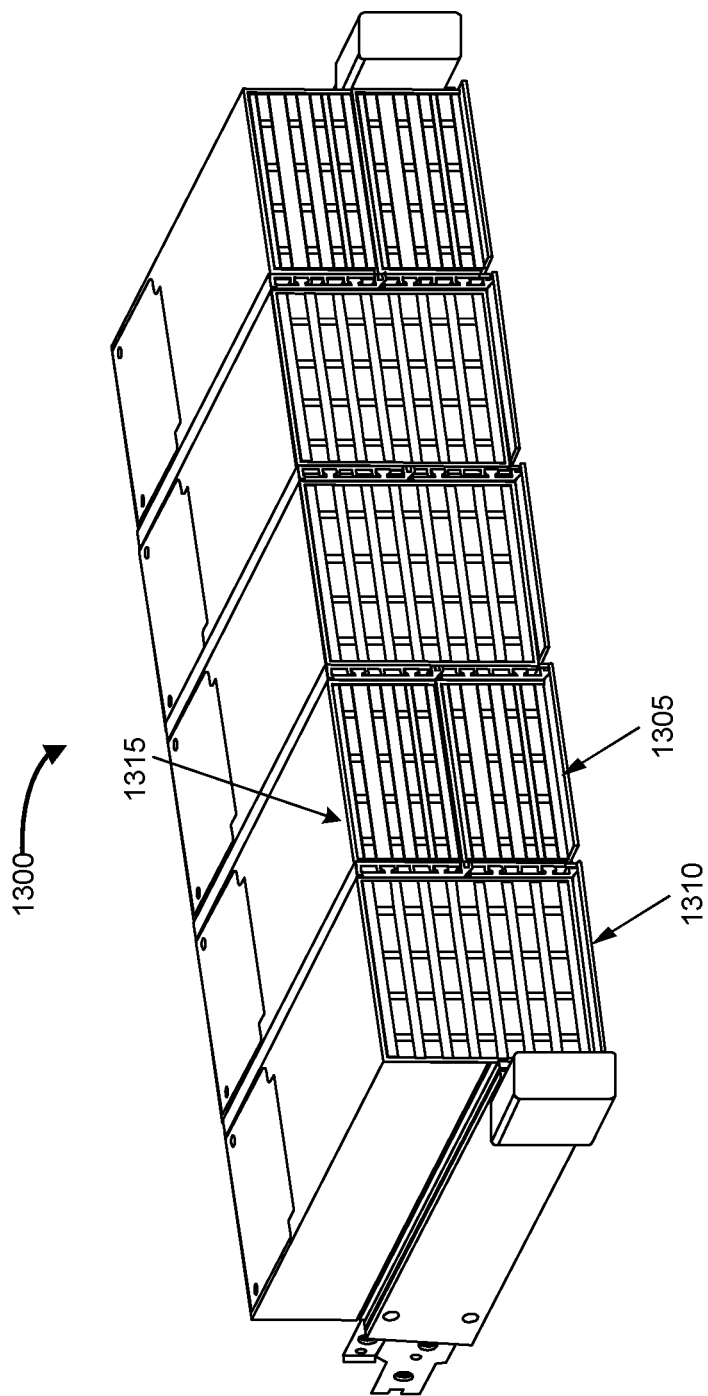
FIG. 13 is a diagram illustrating a chassis assembly with a modular design to support variable configurations of front chassis modules, according to an embodiment of the present disclosure.

The rack chassis 105 has height, depth, and width dimensions that enable insertion and retention of a plurality of individual block assemblies that can accommodate various types and sizes of IT components. For example, the rack chassis 105 can support both single-wide and double-wide block assemblies. In another example, a rack chassis can support single height and double-height block assemblies, such as a one rack unit (1 U) or a two rack units (2 U) server as shown in FIG. 13. The rack chassis 105 includes an interconnected bottom panel and side panels. The bottom panel and the side panels may be made from one continuous single material. For example, the rack chassis includes a rail guide on each side panel. The rack chassis 105 includes a left rail guide 145 and a right rail guide 115 which include a plurality of rails in a lateral direction from front to rear of the rail guides which allows the block assemblies to slide from the front to the rear of the rack chassis 105. The left rail guide 145 is located at the left of the rack chassis 105 and is fixed. The right rail guide 115 is located at the right of the rack chassis 105 and floats, which is moveable from side to side.

In this example, chassis assembly 100 may include five single-wide block assemblies that are interlocked with each other, such as the block assemblies 120a-120e, which provides structural support to minimize sag. However, the number of block assemblies may be less or more than shown. The block assemblies may interlock via the rails on each of its sides and/or the rail guides. For example, the block assembly 120a is interlocked with block assembly 120b, wherein a left rail 125 of the block assembly 120a is interlocked with a right rail 127 of the block assembly 120b. Because the block assembly 120a is the rightmost block assembly of the rack chassis 105, a right rail 117 of the block assembly 120a may be interlocked with the right rail guide 115 of the rack chassis 105. In another example, because block assembly 120b is between the block assembly 120a and block assembly 120c, the left rail 128 of block assembly 120b is interlocked with the right rail 135 of block assembly 120c. In yet another example, because the block assembly 120e is located leftmost of rack chassis 105, the left rail 139 of the block assembly 120e may be interlocked with left rail guide 145. The right rail 138 of the block assembly 120e may be interlocked with the left rail 137 of the block assembly 120d.

Figure 2:
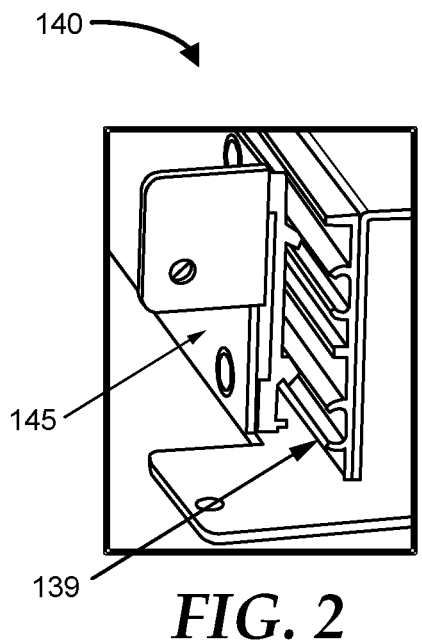
FIG. 2 is a diagram illustrating a section of the chassis assembly, according to an embodiment of the present disclosure.
Figure 3:
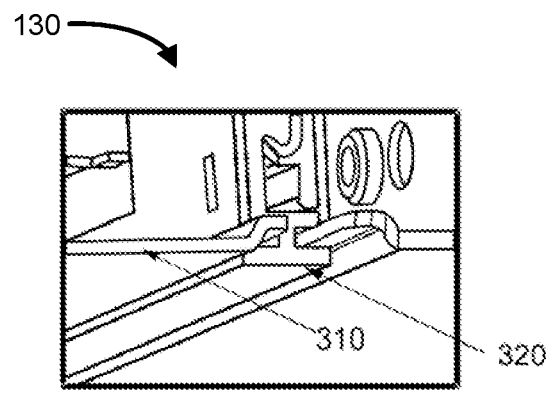
FIG. 3 is a diagram illustrating a section of the chassis assembly, according to an embodiment of the present disclosure.
Figure 4:
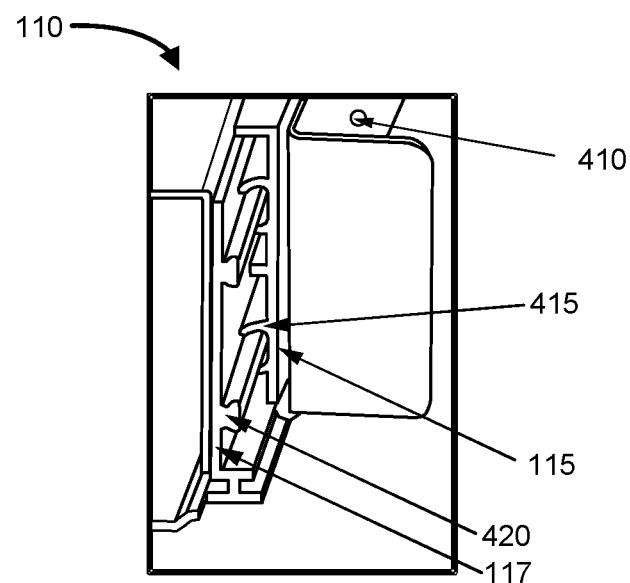
FIG. 4 is a diagram illustrating a section of the chassis assembly, according to an embodiment of the present disclosure.

FIG. 2 shows a perspective view of section 140 of FIG. 1, with a left rail 139 aligning and interlocking with a left rail guide 145 of rack chassis 105. FIG. 3 shows a perspective view of section 130 of FIG. 1 that shows the interlocking of the block assembly to rack chassis 105. Here, the interlocking includes joining and securing a flange 320 of the right rail 135 with a lip 310 of a slot of rack chassis 105. In particular, flange 320 provides alignment and vertical retention for the block assemblies 120b and 120c. FIG. 4 shows a perspective view of section 110 of FIG. 1 with right rail guide 115 joined with the right rail 117 of block assembly 120*a*. In particular, section 110 shows an interlocking feature between a flange 420 of the right rail 117 and a flange 415 of the right rail guide 115. Because right rail guide 115 is not fixed, captive attachment features, such as a screw 410 with one or more other captive attachment features may be used to tighten the right rail guide 115. The captive attachment features allow the right rail guide 115 to move to the right until it rests on the side of the rack chassis 105, pulling the block assemblies tight.

FIG. 5A shows a perspective view of a block assembly 500 which is an example of one of the block assemblies of FIG. 1. The block assembly 500 has height, depth, and width dimensions that allow it to be slid into a chassis like the rack chassis 105. The height of the block assembly 500 may be similar to the height of the chassis while its width may be a fraction of the width of the rack chassis or a multiple of that fraction. The depth of the block assembly 500 may be less than the depth of the rack chassis to accommodate other IT components such as a motherboard, a fan, a power supply, etc. behind the block assembly 500. While the block assemblies have common external features, such as left rails, right rails, and top covers; the interior and back portions may be different based on the IT component to be inserted into the block assembly. For example, the back portion of a block assembly for a storage device may include one or more connectors different than the back portion of another block assembly for a server. The internal portion of the block assembly may include mounting features for the IT components.

Block assembly 500 includes a top cover 530, a rear section, a left panel 555, and a right panel 535. The left panel may also be referred to as a left sidewall. Accordingly, the right panel may also be referred to as the right sidewall. The rear section includes an interior portion and a back portion. The interior portion of the rear section may be adapted to accommodate various fixtures like an attachment, a connector, and a backplane such as a backplane 515. While the back portion of the rear section may be adapted to accommodate cabling. Block assembly 500 may also include a bottom panel which may be connected to the left panel 555, the right panel 535, and the rear section. The top cover 530 is connected to the rear section, the left panel 555, and the right panel 535. In one embodiment, the top cover 530, the rear section, the left panel 555, and the right panel 535 may be continuous portions of a single piece of material. The top cover 530 includes an access panel 525. The backplane 515 can include one or more connectors based on the type of IT component that will be fitted inside the block assembly. The connectors may include power and/or signal connectors. In this example, backplane 515 includes a connector 550 which is a peripheral component interconnect express (PCIe) connector.

The left panel 555 and the right panel 535 each include a rail, such as the left rail and the right rail, both of which may be extruded rails. Each extruded rail may be made from extrudable material such as aluminum, such that the left rail and the right rail may be extruded aluminum rails. In this example, the left panel 555 includes a left rail 510 which is used to align the block assembly 500 with a left rail guide or a right rail of another block assembly. The right panel and/or left panel includes a rail that includes one or more flanges such as a flange 545. The left panel 555 includes a left rail 510 which includes one or more flanges such as a flange 512. The flanges, such as a flange 512 may be used to align the block assembly 500 with another left rail of another block assembly or a right rail guide. While flanges, such as the flange 545, which is similar to flange 320, may be used to join the block assembly 500 to the rack chassis as shown in FIG. 3.

For example, in FIG. 1, the right rail of the block assembly 120*b* may align and interlock with the left rail of the block assembly 120*a*. If the block assembly 500 is the rightmost block assembly similar to the block assembly 120*a*, then right rail 540 may align and interlock with the right rail guide 115 of the rack chassis 105. The interlocking rails retain the block assembly horizontally while the flanges provide alignment and retain the block assembly to the chassis vertically. A front trim assembly may be attached to the front of the rack chassis via the rack ears, which may restrain the block assemblies and/or the IT components. The front trim assembly may include one or more front trim pieces and vented panels for airflow to control the thermal impedance of the chassis assembly.

FIG. 5B shows a perspective view highlighting an interlocking feature 560 joining two rails, or joining a rail and a rail guide. In one example, the right rail has a male profile configured to join with a female profile of the left rail. In another example, the right rail has a female profile configured to join with a male profile of the left rail. Here, the right rail 540 includes one or more male flanges, such as the flange 542. The male flanges may be used to join with female flanges like a female flange 547. The interlocking feature allows a tight tolerance between the rails. For example, a minimum offset distance such as a fraction of an inch or a millimeter (mm) allows sufficient room for the rails to slide with minimum effort without binding. For example, there may be a +/0.15 mm tolerance on the gap between the rails. Vent holes such as a vent hole 570 allow airflow between the block assemblies through the rack chassis.

FIG. 5C shows a perspective view of the chassis which may have a top cover adapted to attach to the top cover of the block assemblies. Here, a portion 580 of a block assembly highlights how a top cover 590 of the rear section can hook underneath a top cover via block assembly hooks, such as hooks 585*a* and 585*b*. In another embodiment, the front section of the chassis may not include a top cover as the top cover of each block assembly may provide the functionality of the top cover for the rack chassis.

Figure 6:
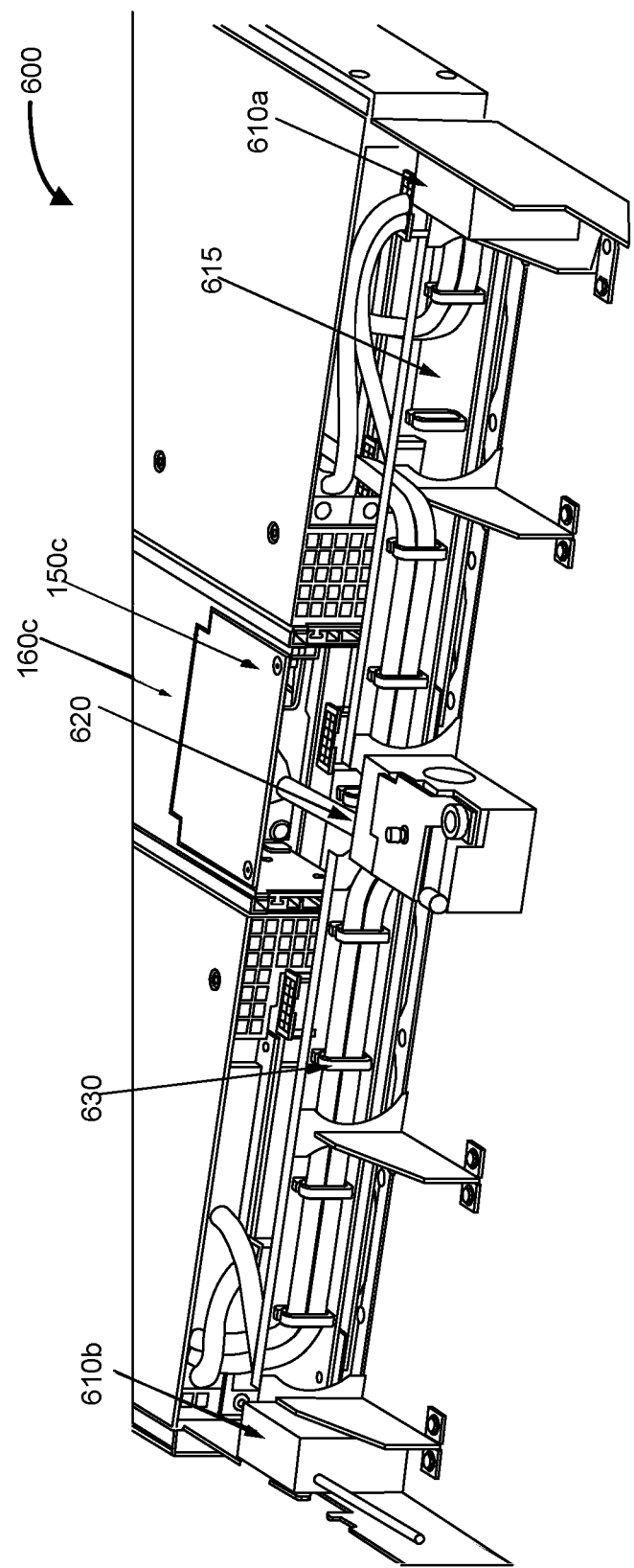
FIG. 6 is a diagram illustrating a rear section of a chassis assembly with a modular design to support variable configurations of front chassis modules, according to an embodiment of the present disclosure.

FIG. 6 shows a perspective view of rear section 600 of a portion of the chassis assembly 100 of FIG. 1. The rear section 600 includes cable routing channels 610*a* and 610*b*, a power board 615, a cable routing channel 620, a cable retention feature 630. The cable retention feature 630 is adapted to retain the routed power and/or signal cables in place. Cable routing channels 610*a*, 610*b*, and 620 may be adapted to allow routing of power and/or signal cables associated with the IT components. The cable routing channel 620 may be adapted to allow signal cables of one or more IT components to be routed through the rear section 600. In one embodiment, cable routing channel 610*a* allows connection from a power supply unit via a power cable to provide power to the chassis assembly. Similar to power block 610*a*, in one embodiment, cable routing channel 610*b* allows connection from the power supply via a power cable. The power supply unit providing power to power block 610*a* may be different than the power supply unit providing power to power block 610*b*. The power board 615, also referred to herein as a power bar, includes a power distribution system that draws power from one or more power supply units via the power blocks 610*a* and 610*b*. The power board 615 provides power for the IT components and other functional components in the chassis assembly 100. The power board 615 may extend from the left side to the right side of the rack chassis 105.

Figure 7:
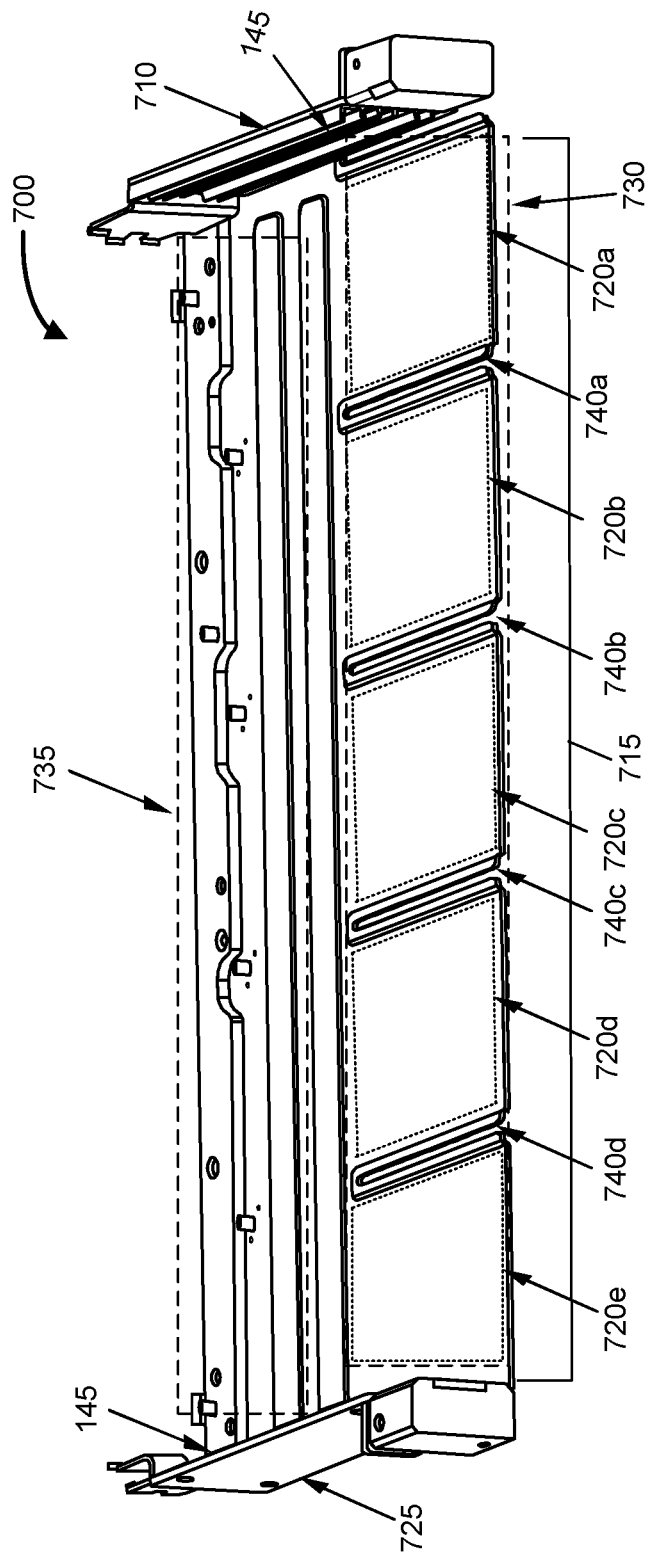
FIG. 7 is a diagram illustrating a rack chassis with a modular design to support variable configurations of front chassis modules, according to an embodiment of the present disclosure.

FIG. 7 shows a perspective view of a rack chassis 700 which is the rack chassis 105 of FIG. 1 before the insertion of the block assemblies. Rack chassis 700 includes a bottom panel 715, a left panel 725, and a right panel 710. The panels may be continuous portions of a single piece of material. The bottom panel 715 may include a front section 730 and a rear section 735. The front section 730 includes one or more slots, such as slots 740a-740d. The front section 730 may also include one or more bays, such as bays 720a-720e, adapted to accommodate one or more block assemblies, wherein each bay is bounded by a slot on each side. For example, bay 720a may accommodate a single-wide block assembly. In addition, bays 720a and 720b may accommodate a double-wide block assembly. The rear section 735 may be adapted to accommodate a power bar which is used to provide power to the IT components. The left panel 725 includes the left rail guide 145. The right panel 710 includes the right rail guide 115.

Figure 8:
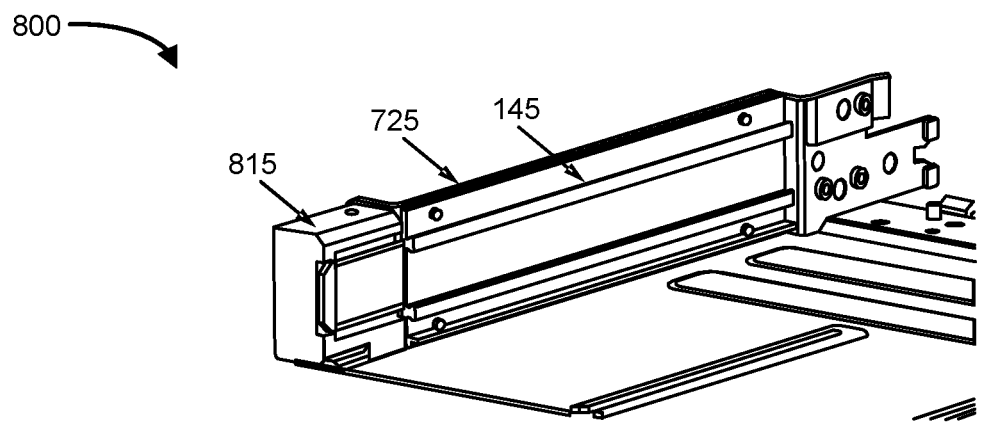
FIG. 8 is a diagram illustrating a left panel of a rack chassis with a modular design to support variable configurations of front chassis modules, according to an embodiment of the present disclosure.
Figure 9:
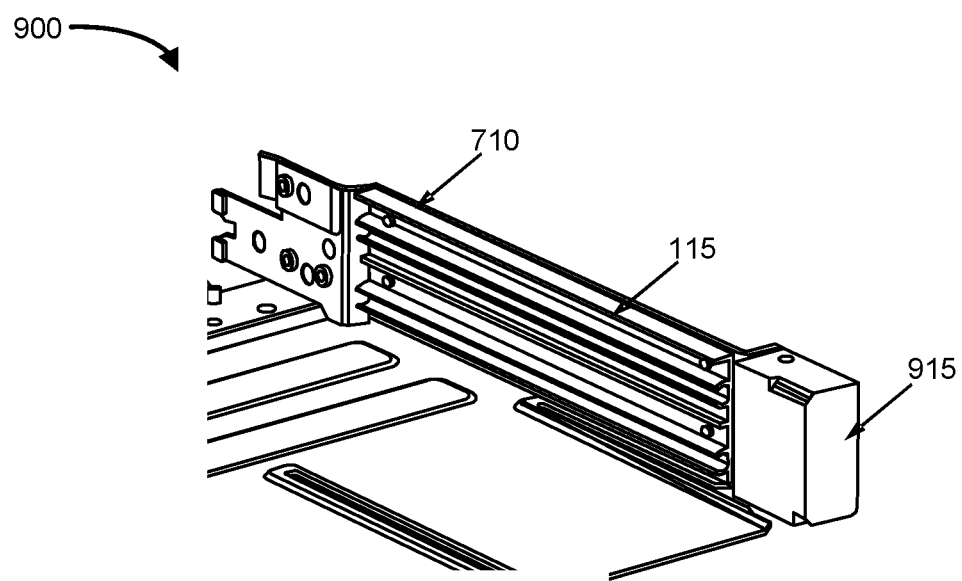
FIG. 9 is a diagram illustrating a right panel of the rack chassis, according to an embodiment of the present disclosure.

FIG. 8 shows a perspective of a section 800 of the left panel 725 of the rack chassis 700. The left panel 725 includes a left rail guide 145 and a left rack ear 815. The left rail guide may be fixed in place by one or more captive attachment features, such as screws, bolts, anchors, or other features that can hold the rail captive or in place. FIG. 9 shows a perspective of a section 900 of the right panel 710 of the rack chassis 700. The right panel 710 includes a right rail guide 115 and a right rack ear 915. Assuming that the right rail guide is not fixed to the right panel, the right rail guide 115 may be adapted to be retained by the one or more captive attachment features. In this embodiment, one of the rail guides is not fixed, such that if the left rail guide is fixed, then the right rail guide is not fixed. Accordingly, if the left rail guide is not fixed, then the right rail guide is fixed.

The captive attachment features, when loosened, allow for side-to-side floating of the rail guide (for example, one to two mm of float), for the rail guide to account for assembly tolerances and avoid being overconstrained during block installation. After the block assemblies are installed, the captive attachment features are tightened which pulls the rail guide to the right or the left, tightening against the chassis sidewall. For example, if the right rail guide is not fixed, then it is pulled to the right when tightened. If the left rail guide is not fixed, then it is pulled to the left when tightened. This in turn pulls each block tight against one another and closes the assembly gaps, increasing the structural rigidity of the chassis assembly. The left rack ear 815 and the right rack ear 915 allow for a front trim cover to be installed at the front of the rack chassis 700 as shown in FIG. 11.

Figure 10:
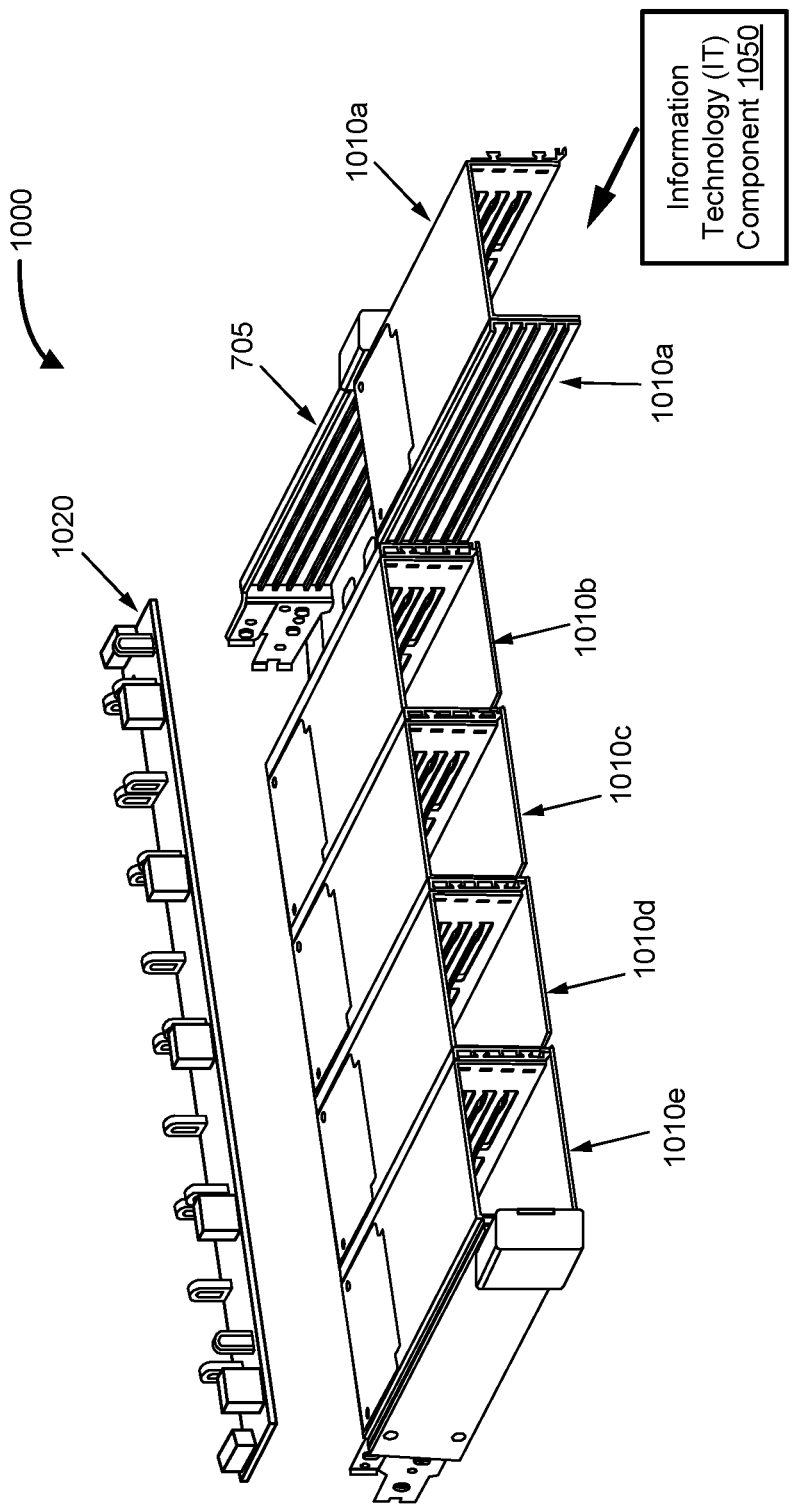
FIG. 10 is a diagram illustrating a chassis assembly with a modular design to support variable configurations of front chassis modules, according to an embodiment of the present disclosure.

FIG. 10 shows a chassis assembly 1000, which is the rack chassis 705 after some block assemblies are inserted. In particular, the chassis assembly 1000 depicts the rack chassis 705 after the block assemblies, such as block assemblies 1010b-1010e are slid or inserted in place with block assembly 1010a being inserted. The block assemblies may be inserted in no particular order. In one example, the rail of a block assembly can align with the rail guide of the rack chassis. The block assembly can then slide in the rack chassis from the front to the rear. Here, the block assemblies 1010b-1010e have been inserted before block assembly 1010a. However, the block assemblies can be inserted in any order. In addition, the block assemblies may be inserted before or after an IT component is in place. In one embodiment, after the block assembly has been inserted in the rack chassis, one or more IT components can be inserted into the block assembly, such as IT component 1050, and connected to a power bar 1020 at the rear section of the rack chassis 705. In another embodiment, the IT component is inserted in the block assembly before the block assembly is inserted in the rack chassis. Power bar 1020 may be physically attached at the rear section of the rack chassis 1005 before the block assemblies have been inserted. The power bar 1020 may also be adapted to allow the block assemblies to be cabled or docked to it.

Figure 11:
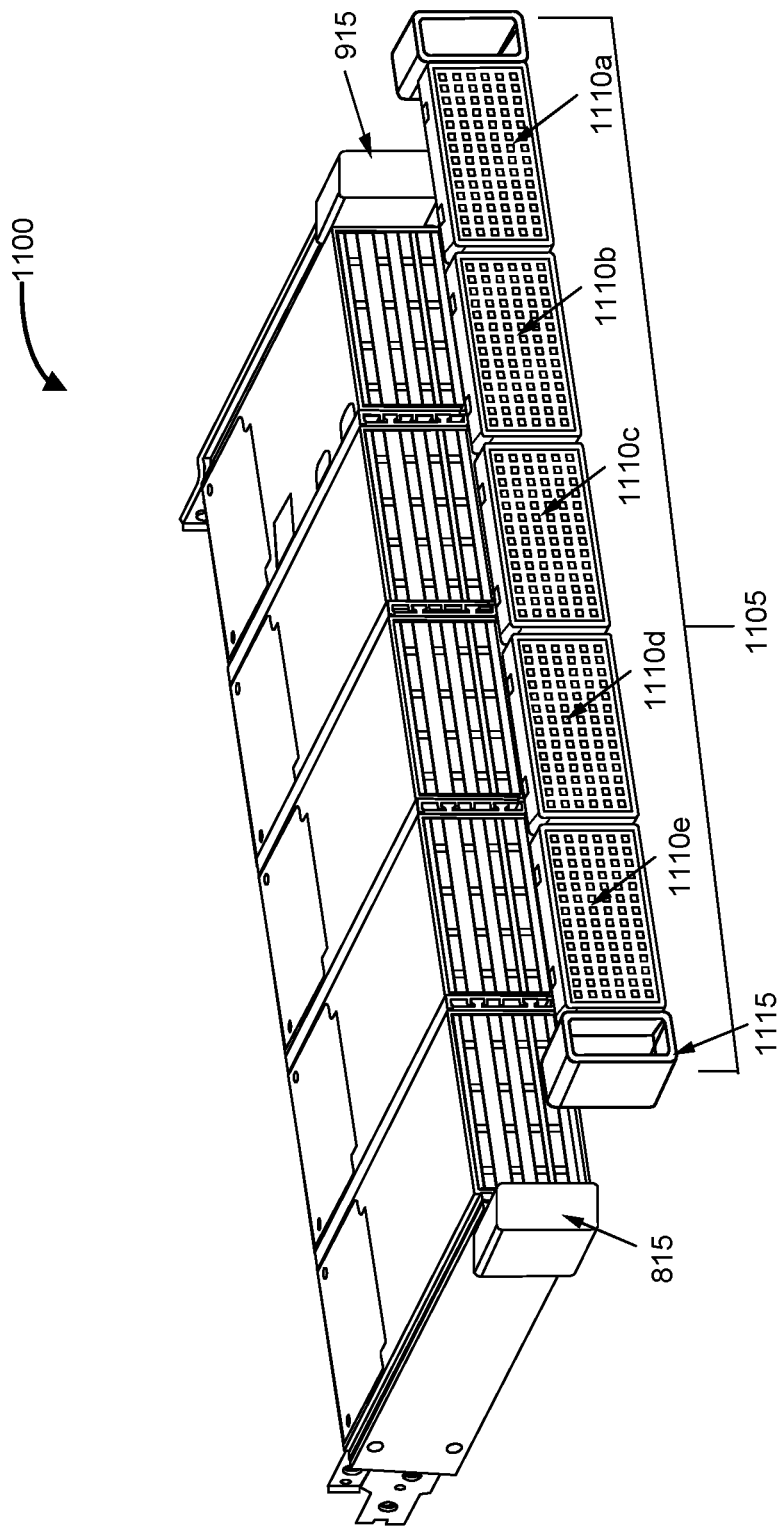
FIG. 11 is a diagram illustrating a chassis assembly with a modular design to support variable configurations of front chassis modules, according to an embodiment of the present disclosure.

FIG. 11 shows a perspective view of a chassis assembly 1100, which is chassis assembly 1000 with the block assemblies and IT components in place before the installation of a front trim assembly 1105. As each of the block assemblies may be adapted to allow the insertion of an IT component, the IT component may be inserted from the front of the block chassis and slid through the rear of the block assembly. The IT component may also be inserted from below the block assembly before sliding the block assembly in the rack chassis. After inserting the IT components, the front trim assembly 1105 may be adapted to slide over the left rack ear 815 and the right rack ear 915.

Figure 12:
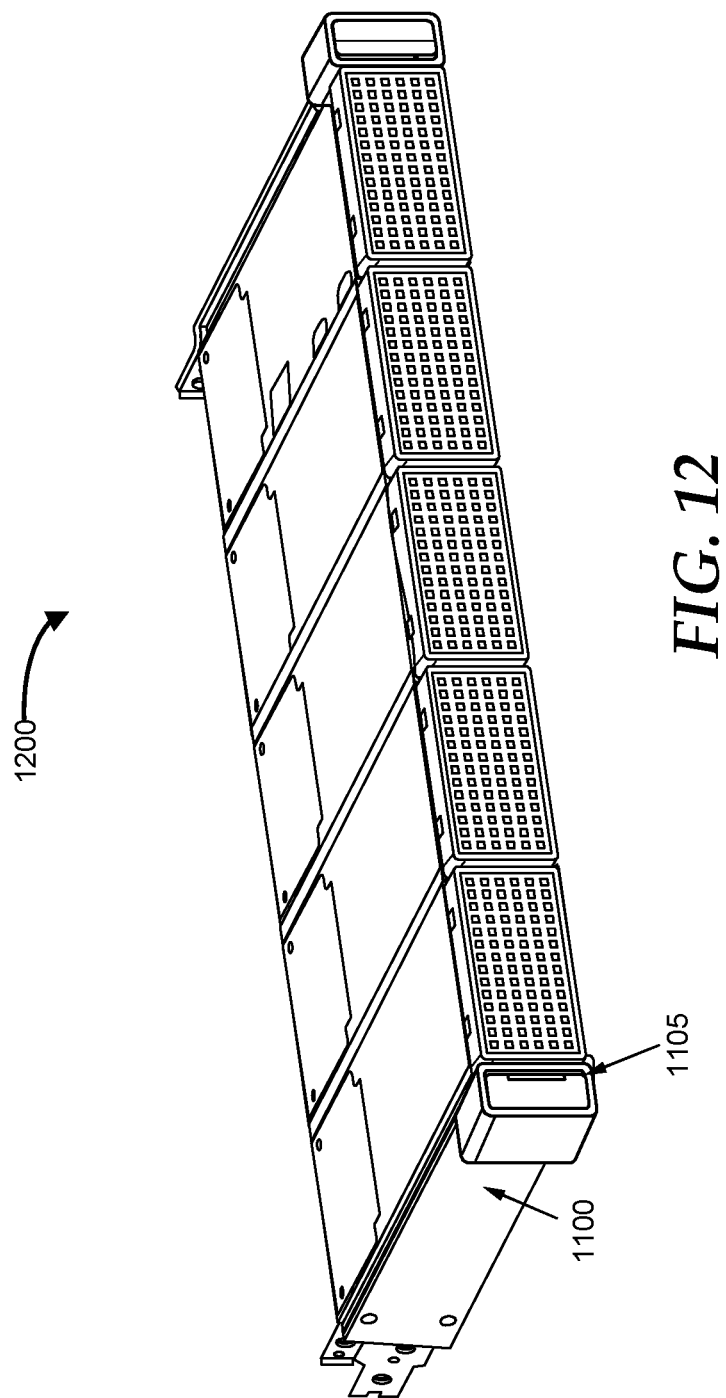
FIG. 12 is a diagram illustrating a chassis assembly with a modular design to support variable configurations of front chassis modules, according to an embodiment of the present disclosure.

The front trim assembly 1105 includes configurable panels 1110a-1110e and a front trim piece 1115. The front trim assembly 1105 may be used to retain the block assemblies in position and provide support to the front edge of the rack chassis. The configurable panels 1110a-1110e may be used to control thermal impedance. As such, each configurable panel may have a vent for airflow. The configurable panel may be locked in place in the front trim piece 1115. Each of the configurable panels can be removed or not used to allow a hot plug IT component or device to be removed or inserted into the block assembly. FIG. 12 shows a perspective view of the chassis assembly 1200 which is the chassis assembly 1100 with the block assemblies, IT components, and the front trim assembly 1105 in place.

FIG. 13 shows a perspective view of an embodiment of a chassis assembly 1300, which is similar to the chassis assembly 1200 of FIG. 12. While the chassis assembly 1200 of FIG. 12 includes single-height block assemblies, the block assemblies in the chassis assembly 1300 includes both single-height block assemblies and double-height block assemblies. For example, block assembly 1310 is a double-height block assembly while block assembly 1305 and block assembly 1315 are single-height block assemblies.

Figure 14:
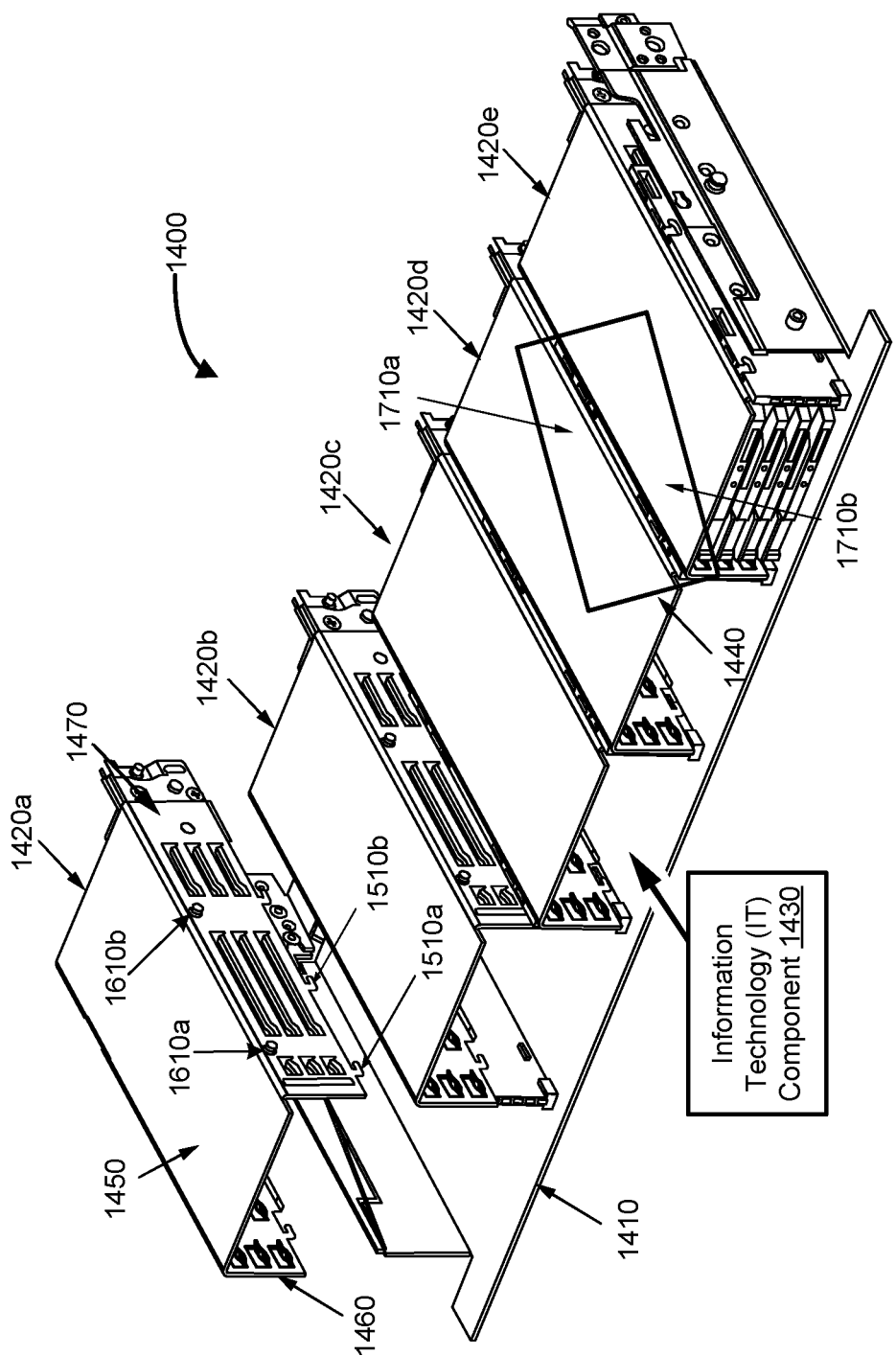
FIG. 14 is a diagram illustrating a chassis assembly with a modular design to support variable configurations of front chassis modules, according to an embodiment of the present disclosure.

FIG. 14 shows a perspective view of a chassis assembly 1400 which is an embodiment of the present disclosure. Chassis assembly 1400 includes a rack chassis 1410 and more than one block assemblies, such as block assemblies 1420a-1420e. The rack chassis 1410 includes one or more divider walls, wherein the bottom of each of the divider walls may include one or more slots, and wherein the top of each of the divider walls may include one or more T-nuts which may be chamfered. Each of the block assemblies includes a top cover, a rear section, a left panel, and a right panel which may be continuous portions of a single piece of material. For example, the block assembly 1420a includes a top cover 1450, a left panel 1460, and a right panel 1470. Instead of sliding the block assemblies into the rack chassis 1410 from the front, the block assemblies typically drop in from the top and slides backward. The block assembly may be dropped in between two of the divider walls. A hook and slot feature may be used to lock the block assemblies into place, cinching the block assembly vertically. In particular, one or more hooks of the block assembly may lock into one or more slots of each of the two divider walls, wherein the hooks are located towards the bottom of the left panel and the right panel. The slots may be located towards the bottom of the divider walls. In addition, each of the block assemblies may be secured into place using one or more securing features such as screws. The screws may be located towards the top of the right panel and left panel. Afterwards, an IT component such as IT component 1430 may be slid into one of the block assemblies.

Figure 15:
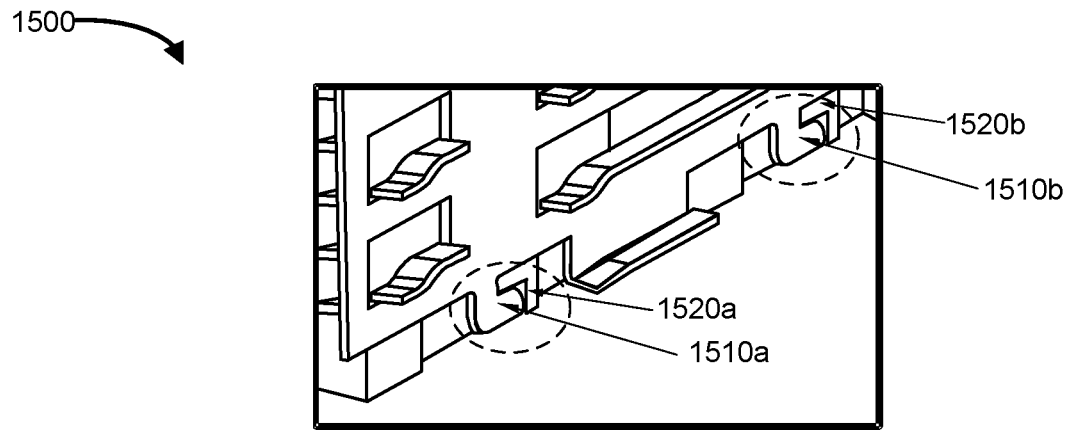
FIG. 15 is a diagram illustrating a perspective view of a section of the chassis assembly, according to an embodiment of the present disclosure.
Figure 16:
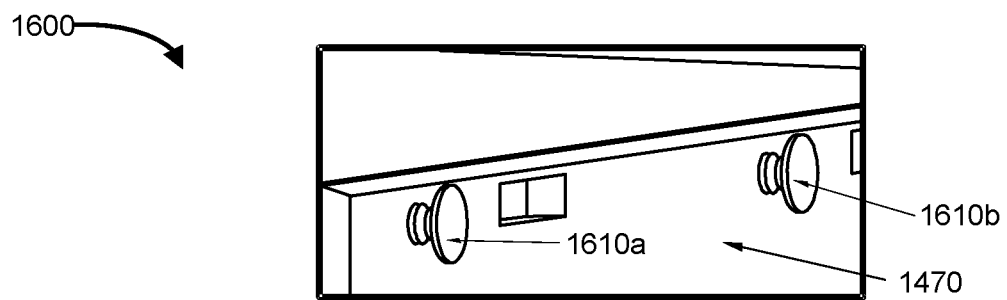
FIG. 16 is a diagram illustrating a perspective view of a section of the chassis assembly, according to an embodiment of the present disclosure.
Figure 17:
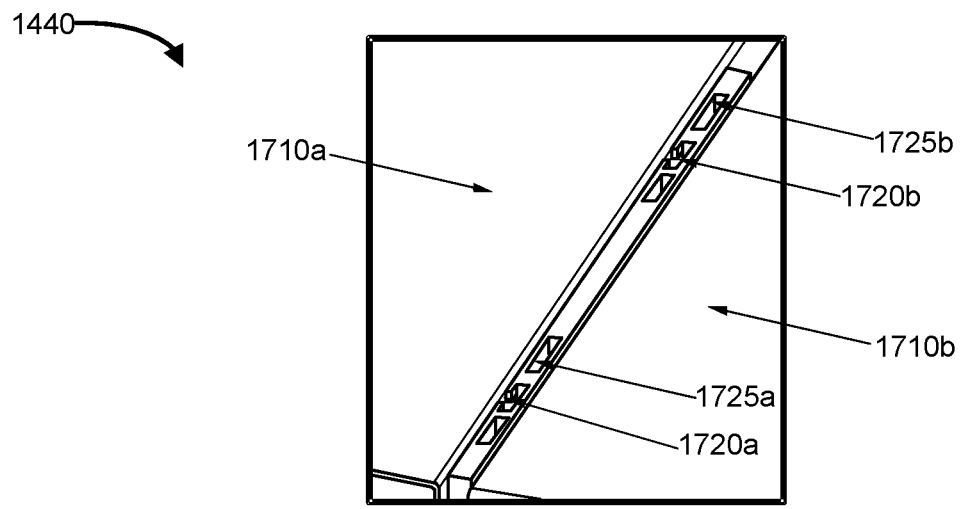
FIG. 17 is a diagram illustrating a perspective view of a section of the chassis assembly, according to an embodiment of the present disclosure.

FIG. 15 shows a perspective view of a section 1500 of a hook and slot mechanism implemented in the chassis assembly 1400 of FIG. 14. In this embodiment, each of the block assemblies includes hooks to secure the block assemblies to slots in the rack chassis. Here, the block assembly 1420a includes hooks 1510a and 1510b that slides into slots 1520a and 1520b of a divider of the rack chassis 1410 accordingly. FIG. 16 shows a perspective view of section 1600 of a chamfered T-nut mechanism that may be used to lock or cinch the block assembly in place. For example, section 1600 shows a T-nut 1610a and 1610b located towards the top of the right panel 1470. FIG. 17 shows a perspective view of a section 1440 which shows a portion of a locking mechanism for top covers of the block assemblies. In particular, the section 1440 includes portions of top covers 1710a and 1710b of block assemblies 1420d and 1420e as shown in FIG. 14. The right panel 1470 includes T-nuts that lock into slots 1720a and 1720b which are in the divider walls of the rack chassis. The T-nuts lock into the slots when the block assembly is dropped in from the top of the rack chassis and slid back cinching the block assembly horizontally. The locking mechanism may also include slots 1725a and 1725b for hooks of a cover of the rack chassis.

Figure 18:
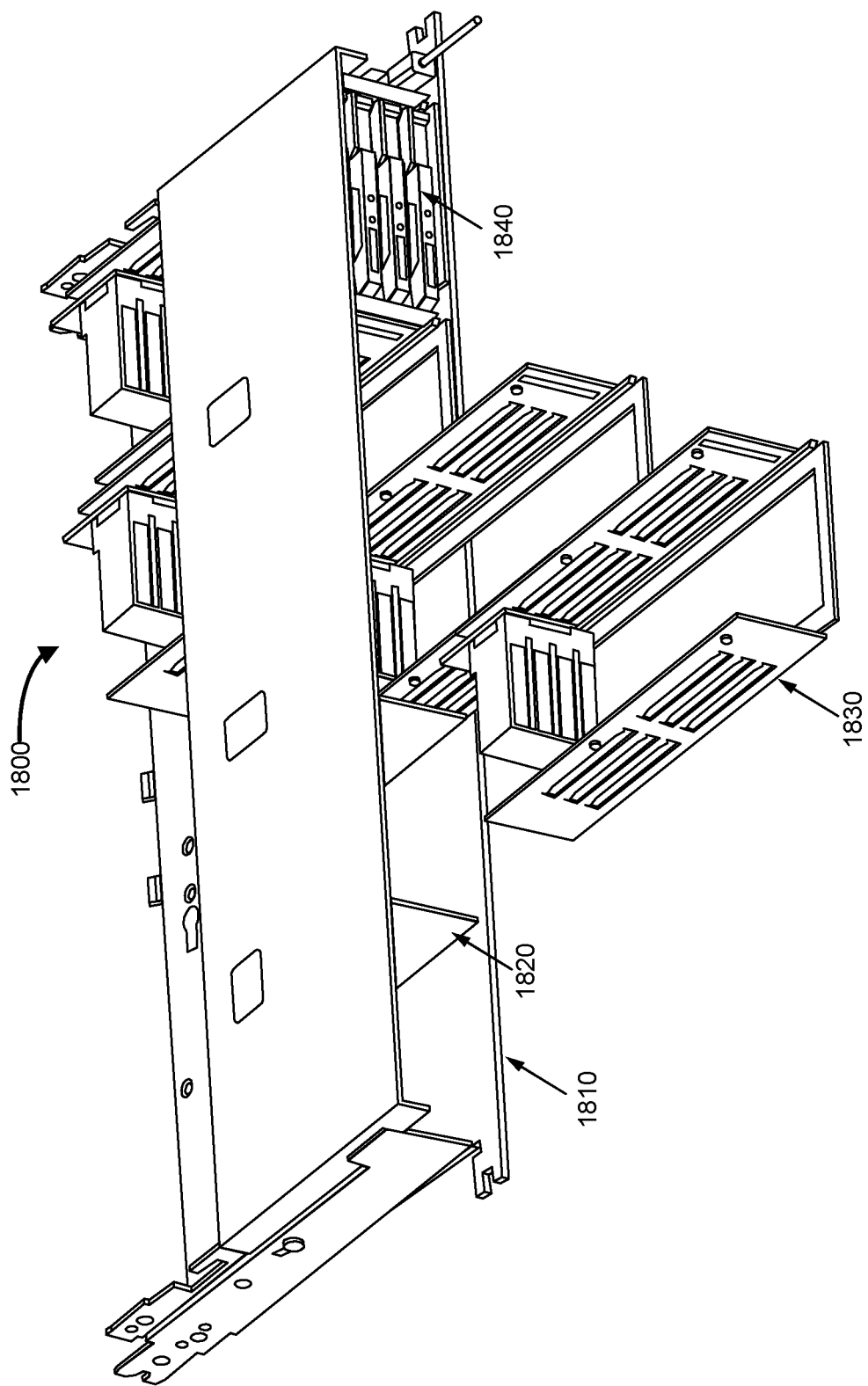
FIG. 18 is a diagram illustrating a chassis assembly with a modular design to support variable configurations of front chassis modules, according to an embodiment of the present disclosure.
Figure 19:
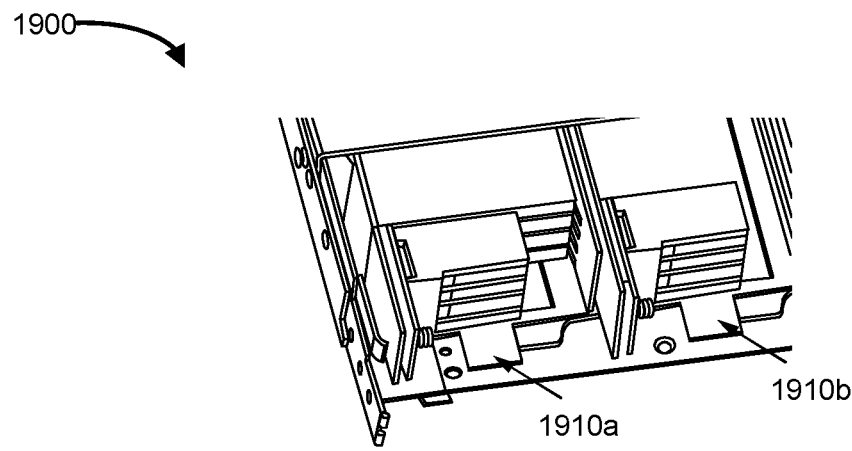
FIG. 19 is a diagram illustrating a perspective view of a section of the chassis assembly, according to an embodiment of the present disclosure.

FIG. 18 shows a perspective view of a chassis assembly 1800 which is yet another embodiment of the present disclosure. Chassis assembly 1800 includes a rack chassis 1810 and at least one divider such as a divider 1820. One of the dividers may be removed to allow for a wider block assembly to be slid into the rack chassis. Rack chassis 1810 may be adapted to allow more than one block assembly such as a block assembly 1830 to slide in place. The block assembly 1830 includes a bottom panel, a rear section, a left panel, and a right panel which may be continuous portions of a single piece of material. The block assembly 1830 may be configured to slide into rack chassis 1810 from the front, where the divider walls may be adapted to guide a block assembly into place at the rear of the rack chassis, wherein the left sidewall is flushed with one of the divider walls and the right sidewall is flushed with another one of the divider walls. After the block assemblies are slid in the rack chassis, the block assemblies may be secured to the rack chassis with one or more screws via a secure tab 1910a and 1910b as shown in a perspective view 1900 of FIG. 19. The screws may be located at the rear section of the rack chassis. The chassis may also include a top cover that can be installed after insertion of the block assemblies.

Figure 20:
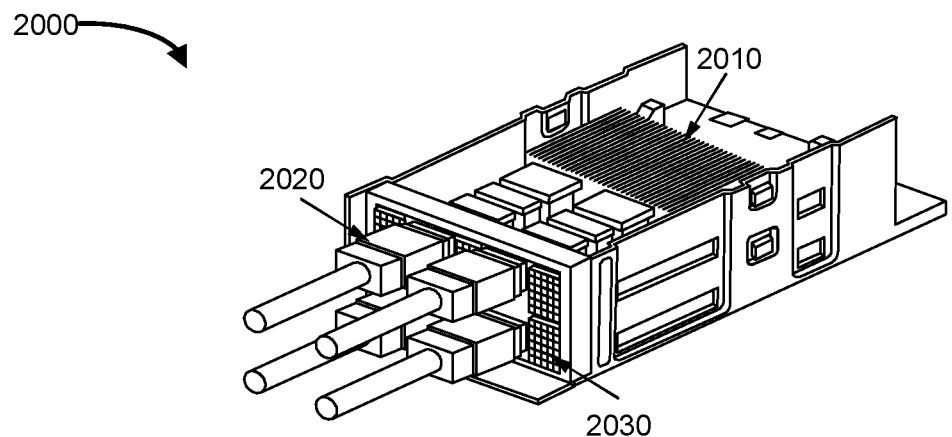
FIG. 20 is a diagram illustrating a perspective view of a section of the chassis assembly, according to an embodiment of the present disclosure.

An IT component, such as IT component 1840 may be inserted into the block assembly after the block assembly is securely attached to the rack chassis. The IT component may also be inserted into the block assembly before the block assembly is slid into the rack chassis. IT component 1840 may be a hot plug device or a cold plug device. Referring to FIG. 20, cold plug devices, such as an IT component 2010, may be pre-installed in the block assembly before the block assembly is slid down the rack chassis as shown in block assembly 2000 of FIG. 20. Block assembly 2000 also includes one or more connectors for a signal cable such as a connector 2020. In addition, block assembly 2000 can include a panel 2030 with airflow channels or vents. The rack chassis includes a front section and a rear section similar to the sections shown in FIG. 7.

References within the specification to "one embodiment," "an embodiment," "embodiments," or "one or more embodiments" are intended to indicate that a particular feature, structure, or characteristic described in connection with the embodiment is included in at least one embodiment of the present disclosure. The appearance of such phrases in various places within the specification is not necessarily referring to the same embodiment, nor is separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific components, devices, and/or corresponding acronyms thereof, are for examples only and not meant to imply limitations on the described embodiment. The embodiments may thus be described with different nomenclature and/or terminology utilized to describe the components, devices, etc. without limitation. References to any specific protocol or proprietary name in describing one or more elements, features, or concepts of the embodiments are provided solely as examples of one implementation, and such references do not limit the extension of the claimed embodiments to embodiments in which different elements, features, protocols, or concept names are utilized. Thus, each term utilized herein is to be given its broadest interpretation given the context in which those terms are utilized.

Although only a few exemplary embodiments have been described in detail above, those skilled in the art will readily appreciate that many modifications are possible in the exemplary embodiments without materially departing from the novel teachings and advantages of the embodiments of the present disclosure. For example, although examples described above include chassis assemblies with a rack chassis as a base, wherein the chassis assembly may be adapted to be part of a rack assembly. The chassis assemblies may use a server chassis as the base instead of the rack chassis. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A chassis assembly comprising:
a chassis including a bottom panel, a left side panel, and a right side panel that are of one continuous single material, wherein the left side panel includes a left rail guide that is fixed to the left side panel, wherein the right side panel includes a right rail guide that is moveable from the right side panel by a captive attachment, wherein the captive attachment is adapted to pull the right rail guide to the right side panel when the captive attachment is tightened, and wherein the bottom panel includes slots; and
a plurality of block assemblies, each block assembly of the block assemblies including a left rail attached to a left sidewall and a right rail attached to a right sidewall, wherein the left rail of the left sidewall of a leftmost block assembly of the block assemblies interlocks with the left rail guide of the chassis when sliding from a front to a rear of the chassis, wherein the right rail of the right sidewall of a rightmost block assembly of the block assemblies interlocks with the right rail guide of the chassis when sliding from the front to the rear of the chassis, wherein the right rail of each block assembly of the block assemblies includes a flange that is adapted to secure and interlock to lips of the slots of the bottom panel of the chassis, and wherein the left rail of each block assembly of the block assemblies is configured to interlock with the right rail of each block assembly of the block assemblies.

2. The chassis assembly of claim 1, wherein the right rail has a female profile that is configured to join with a male profile of the left rail.

3. The chassis assembly of claim 1, wherein the chassis includes a power board.

4. The chassis assembly of claim 1, wherein an information technology component is inserted into a block assembly from a front section of the chassis.

5. The chassis assembly of claim 1, wherein each block assembly may be inserted into any of one or more bays of the front of the chassis.

6. The chassis assembly of claim 1, wherein a first depth of each block assembly is less that a second depth of the chassis.

7. The chassis assembly of claim 1, further comprising a front trim assembly to retain the block assemblies in the chassis.

8. The chassis assembly of claim 7, wherein the front trim assembly includes a vented panel.

9. A chassis assembly comprising:
a chassis including a bottom panel, a left side panel, and a right side panel, wherein the left side panel is fixed, and wherein the right side panel includes a right rail guide that is movable, and wherein the bottom panel includes slots; and
a plurality of block assemblies, and wherein each block assembly of the block assemblies includes a left rail and a right rail, wherein the left rail of a leftmost block assembly of the block assemblies interlocks with a left rail guide of the left side panel of the chassis, wherein the right rail of a rightmost block assembly of the block assemblies interlocks with the right rail guide of the chassis, wherein a captive attachment feature tightens the right rail guide pulling the rightmost block assembly along with the block assemblies to the right side panel, wherein the right rail of each block assembly of the block assemblies includes a flange that is adapted to secure and interlock with a slot of the slots of the bottom panel, and wherein the left rail of each block assembly of the block assemblies is configured to interlock with the right rail of each block assembly of the block assemblies.

10. The chassis assembly of claim 9, wherein the right rail has a female profile that is configured to join with a male profile of the left rail.

11. The chassis assembly of claim 6, wherein the chassis includes a power board.

12. A chassis assembly comprising:
a chassis including a bottom panel, a left side panel with a left rail guide that is fixed to the left side panel, and a right side panel with a right rail guide that is moveable from the right side panel by a captive attachment, wherein the captive attachment is adapted to pull the right rail guide to the right side panel when the captive attachment is tightened, and wherein the bottom panel includes slots; and
a plurality of block assemblies, wherein each block assembly of the block assemblies includes a left sidewall with a left rail and a right sidewall with a right rail, wherein the left rail of the left sidewall of a leftmost block assembly is configured to interlock with the left rail guide of the chassis when sliding from a front of the chassis, wherein the right rail of the right sidewall of a rightmost block assembly is configured to interlock with the right rail guide of the chassis when sliding from the front of the chassis, and wherein the left rail of each block assembly of the block assemblies includes a flange to engage with a slot of the slots of the bottom panel, and wherein the left rail of each block assembly of the block assemblies is configured to interlock with the right rail of each block assembly of the block assemblies.

13. The chassis assembly of claim 12, wherein the right rail has a female profile that is configured join with a male profile of the left rail.

14. The chassis assembly of claim 12, wherein the right rail has a male profile configured to join with a female profile of another left rail.

15. The chassis assembly of claim 12, wherein the chassis includes a power board.

16. The chassis assembly of claim 12, wherein an information technology component is inserted into a block assembly from the front of the chassis.

17. The chassis assembly of claim 12, wherein each block assembly may be inserted into any of one or more bays of the front of the chassis.

* * * * *